(12) United States Patent
Tung et al.

(10) Patent No.: US 6,390,394 B1
(45) Date of Patent: May 21, 2002

(54) NOZZLE AND ADJUST MODULE

(75) Inventors: Fu-Ching Tung, Hsin-Chu; Chia-Ming Chen, Chang Hua Hsien; Jen-Rong Huang; Jonathan Wang, both of Hsin Chu, all of (TW); Peter L. Mahneke, Bucholz (DE)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 09/727,494

(22) Filed: Dec. 4, 2000

(51) Int. Cl.⁷ .............................................. B05B 15/08
(52) U.S. Cl. ................. 239/587.1; 239/587.2; 239/587.3
(58) Field of Search ............................ 239/587.1, 587.2, 239/587.3, 587.4, 587.5, 587.6, 577, 581.1, 537, 538; 118/715; 427/248.1

(56) References Cited

U.S. PATENT DOCUMENTS 3,972,424 A * 8/1976 Levy et al. ................. 214/1 Q
4,236,851 A * 12/1980 Szasz ........................... 406/72
5,485,644 A * 1/1996 Shinbara et al. ............. 15/21.1
5,730,370 A * 3/1998 Bowen ..................... 239/587.4
5,746,834 A * 5/1998 Hanley ........................ 118/715

* cited by examiner

Primary Examiner—William C. Doerrler
Assistant Examiner—Davis Hwu
(74) Attorney, Agent, or Firm—Rabin & Berdo, P.C.

(57) ABSTRACT

The present invention relates to a nozzle and adjust module of chemicals when wafers are processed during the IC manufacturing process. After wafers are loaded on a chuck of a reaction chamber, five chemicals required for the manufacturing process are transported into the passages, and are sprayed on the surfaces of rotating wafers via different nozzles. The centrifugal effect due to the rotation of a main motor is exploited to coat the chemicals on the whole wafer quickly and uniformly. The present invention can apply to both closed and open reaction chambers. The spray head of the present invention has a specially designed angle, and has level adjusting and height adjusting functions so that high flexibility in the manufacturing process can be obtained.

4 Claims, 10 Drawing Sheets

NOZZLE AND ADJUST MODULE

FIELD OF THE INVENTION

The present invention relates to a nozzle and adjust module and, more particularly, to a nozzle and adjust module of chemicals when wafers are processed during the integrated circuit (IC) manufacturing process.

BACKGROUND OF THE INVENTION

A prior art nozzle system for rotating wafers mainly uses a pump to extract chemicals from an acid-providing system to a spray head of a chemical reaction chamber, and then sprays the chemicals on the front surfaces of rotating wafers via the nozzle of the spray head, thereby completing the supply of chemicals for the rotating wafers.

In the prior art, the nozzle is fixed in the spray head, and the spraying direction of chemicals is perpendicular to the surface of the wafer. Therefore, back spilling may easily occur, resulting in contamination of the wafer. Although the nozzle can make straight reciprocation or level swing along with the spray arm, these types of motions apply only to open reaction chambers, and cannot be adopted in closed reaction chambers. Moreover, the angle and height of the nozzle cannot be adjusted to match the necessity of manufacturing process.

SUMMARY OF THE INVENTION

The primary object of the present invention is to provide a nozzle and adjust module. The present invention relates to a nozzle and adjust module of chemicals when wafers are processed during the IC manufacturing process. In the present invention, chemicals required for the manufacturing process are extracted by a pump to a nozzle in a spray head via the passage of a spray arm, and are then sprayed on the surfaces of wafers in a specially designed angle matching to the rotation direction of the wafers, thereby completing the supply of chemicals. Uniform coating can be achieved, and contamination due to back spilling will not easily arise.

Another object of the present invention is to provide a nozzle and adjust module, which can provide five different chemicals, and the height of whose spray arm can be adjusted to match the necessity of manufacturing process. In other words, the acid-spraying system can apply to both closed and open fabrication environments.

Yet another object of the present invention is to provide a nozzle and adjust module, wherein two rotating mechanisms manually adjustable are designed on the spray arm thereof in consideration of conveniences of maintenance and assembly/disassembly. The highly flexible adjusting mechanism of the present invention can meet the requirements of future common or special manufacturing processes.

To achieve the above objects, the present invention provides a nozzle and adjust module comprising a spray head and nozzle mechanism and a closed reaction chamber formed of an upper cover of reaction chamber and a rotation chuck. The spray head and nozzle mechanism is used for spraying chemicals and meeting the requirements of the manufacturing process calling for specific angle of nozzle. The spray head has a plurality of sideward grooves of specific angle and a plurality of ball seats for the placement of nozzles and ball connectors, respectively. Each sideward groove has a nozzle depressor to cover the ball connector. Thereby, the nozzle can be tilted a proper angle and adjusted. The top end of the nozzle is connected to an acid-providing system via a bent pipe.

A cover plate of spray head joins a connecting plate so that the levels of the spray head and the upper cover of reaction chamber can be adjusted through a level adjusting mechanism of the spray head. The spray head also has a ringed channel to suck up the upper cover by means of vacuum clamping. Contamination of wafers due to particles generated when screwing screws can be avoided. Moreover, an acid-resistant O-ring is matched to prevent the leakage of chemicals.

The level adjusting mechanism of the spray head comprises a connecting plate and a level adjusting plate. The level adjusting plate has a plurality of sets of adjusting studs and locking studs. Moreover, an outer housing of reaction chamber and a spray arm are fixed on the level adjusting plate using a clamping block and a clamping stud, respectively.

The rotation mechanism of the present invention comprises a spray arm and a rotation seat. A clamping stud of the rotation seat clamps the spray arm and is placed on a supporting seat. The rotation seat and the supporting seat are connected via a bearing so that the spray arm can rotate freely. The whole spray arm is clamped steadily. Two sets of rotation seats and supporting seats are adopted so that they can be evenly fixed on an elevating plate. The elevating plate is locked with an elevating slide block. Once an elevating motor starts to rotate, the elevating slide block will be driven by a screw bar to generate straight motion, thereby driving the spray arm to make straight elevation.

The various objects and advantages of the present invention will be more readily understood from the following detailed description when read in conjunction with the appended drawings, in which:

DETAILED DESCRIPTION OF THE PREFERRED EMBODIMENTS

Please refer to FIGS. 1 to 4. The present invention comprises three modular mechanisms to resolve corresponding problems. The present invention comprises a spray head and nozzle mechanism, a level adjusting mechanism of spray head, and a rotation mechanism of spray arm. The spray head and nozzle mechanism (shown in FIG. 3) is used for spraying chemicals and meeting the requirements of manufacturing process calling for specific angle of nozzle.

An upper cover of reaction chamber and a chuck form a closed reaction chamber, or form an open space of specific spacing to match special manufacturing processes. The level adjusting mechanism of spray head (shown in FIG. 1) is used for adjusting the gap and level of the upper cover and the chuck. The adjustment will also influence the levels of the spray head and the nozzle. Moreover, the positions where the spray head sprays on the surfaces of wafers will be changed. The rotation mechanism of spray arm (shown in FIG. 4) is used for the rotation of the whole nozzle module. The means of motion is designed to be manual mainly in consideration of conveniences of maintenance and assembly/disassembly of components of the reaction chamber.

Figure 1:
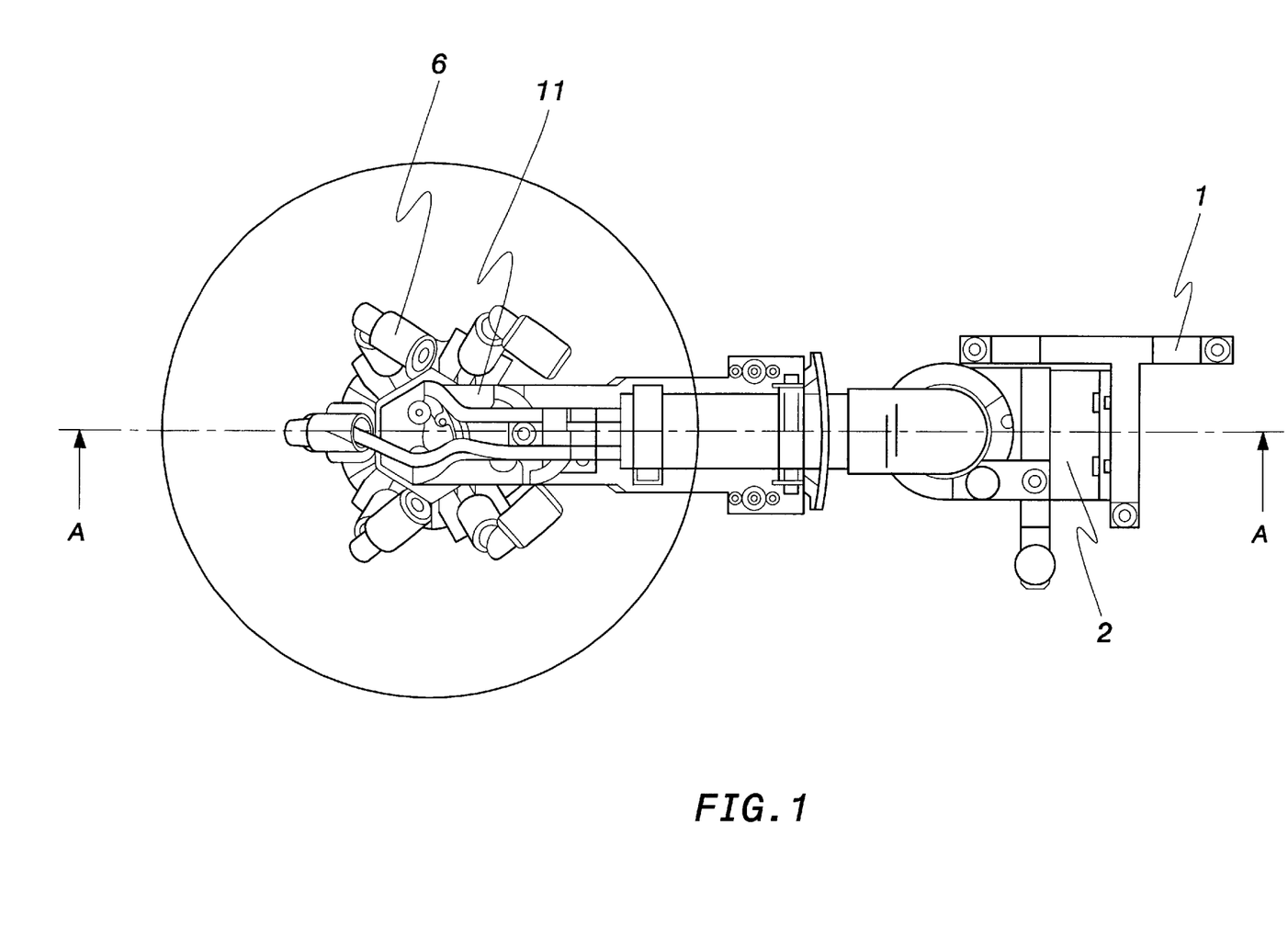
FIG. 1 is a top view of the present invention.
Figure 2:
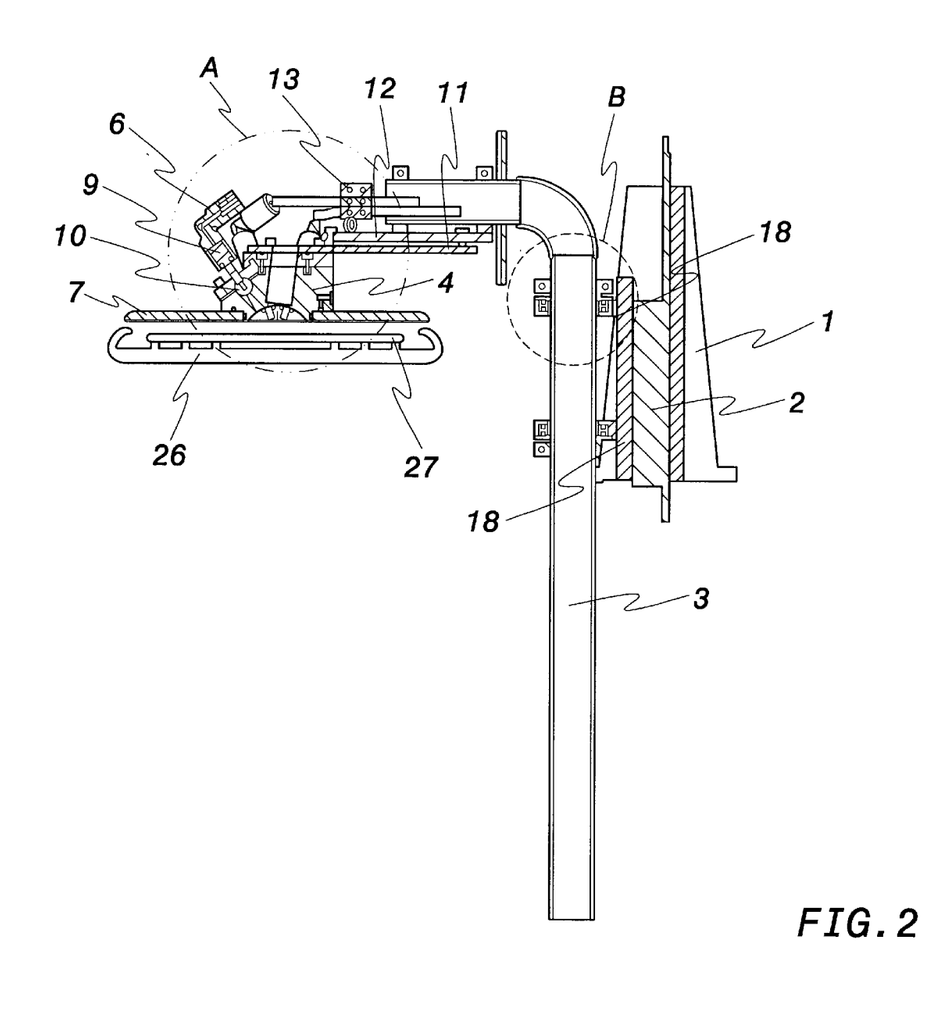
FIG. 2 is a cross-sectional view of the present invention along the A—A line in FIG. 1.
Figure 3:
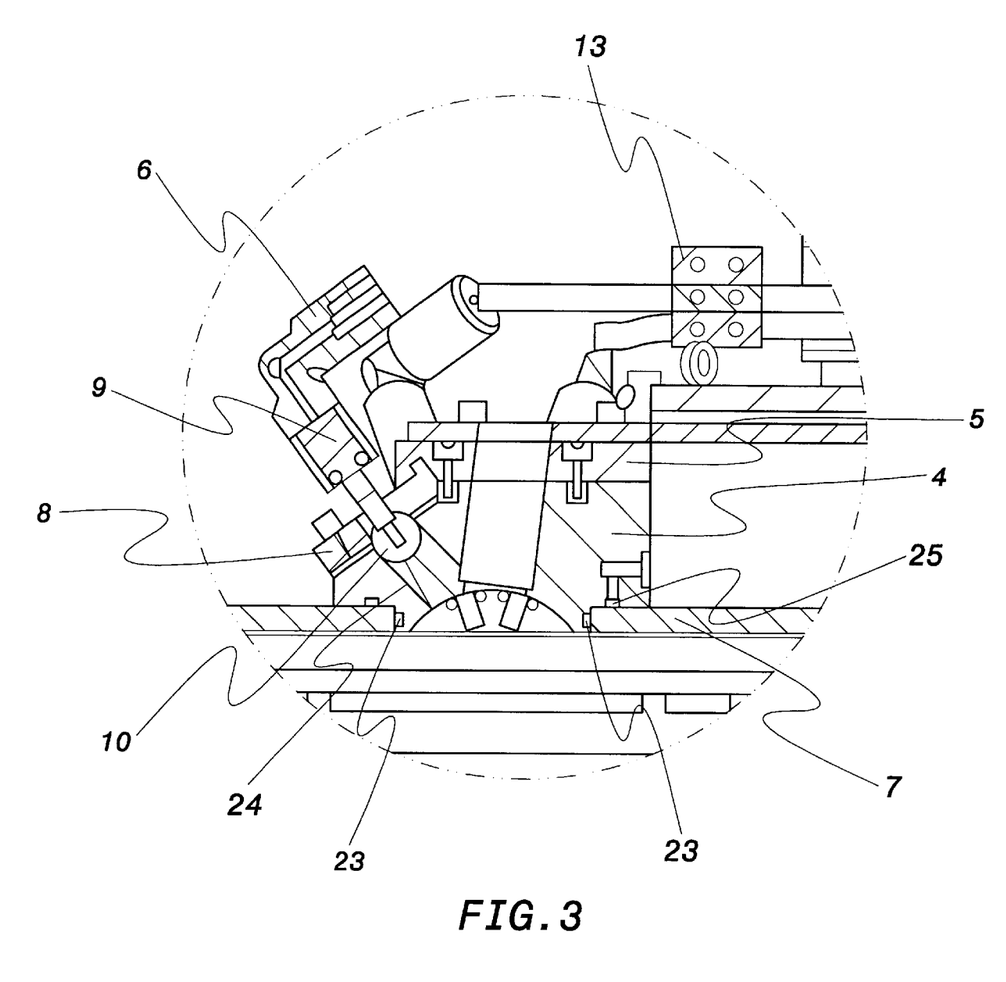
FIG. 3 is an enlarged view of the present invention of part A in FIG. 2.
Figure 4:
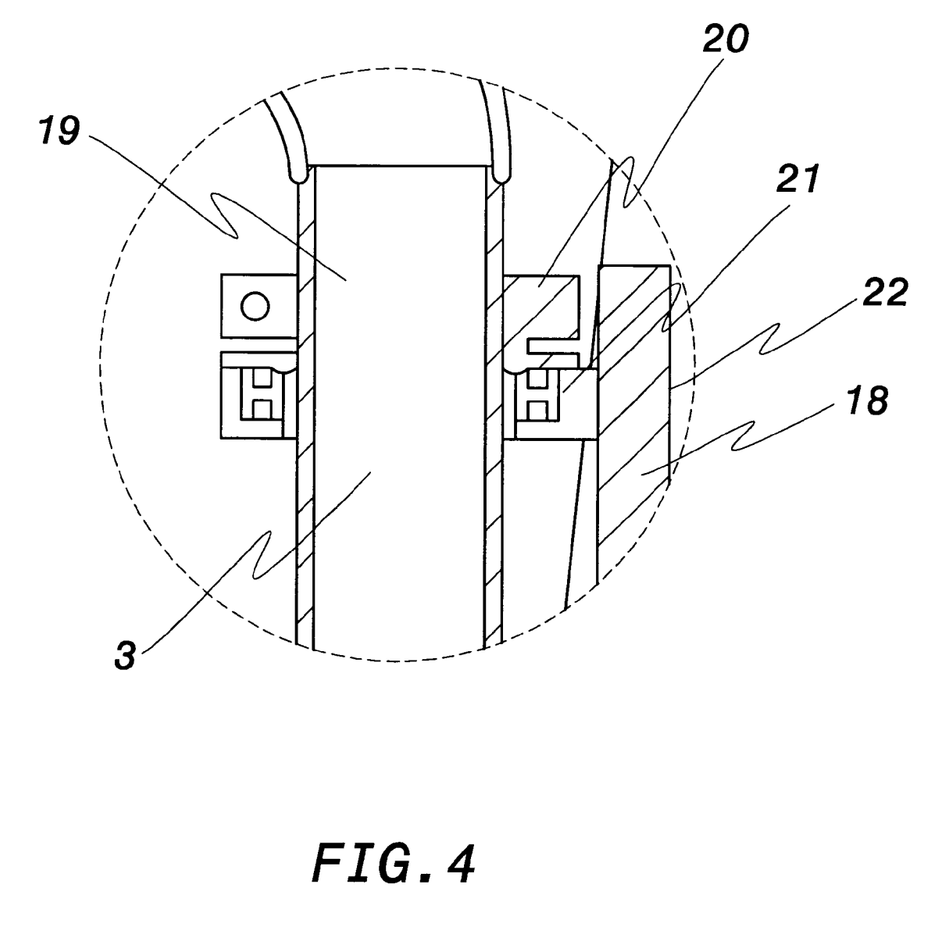
FIG. 4 is an enlarged view of the present invention of part B in FIG. 2.
Figure 5:
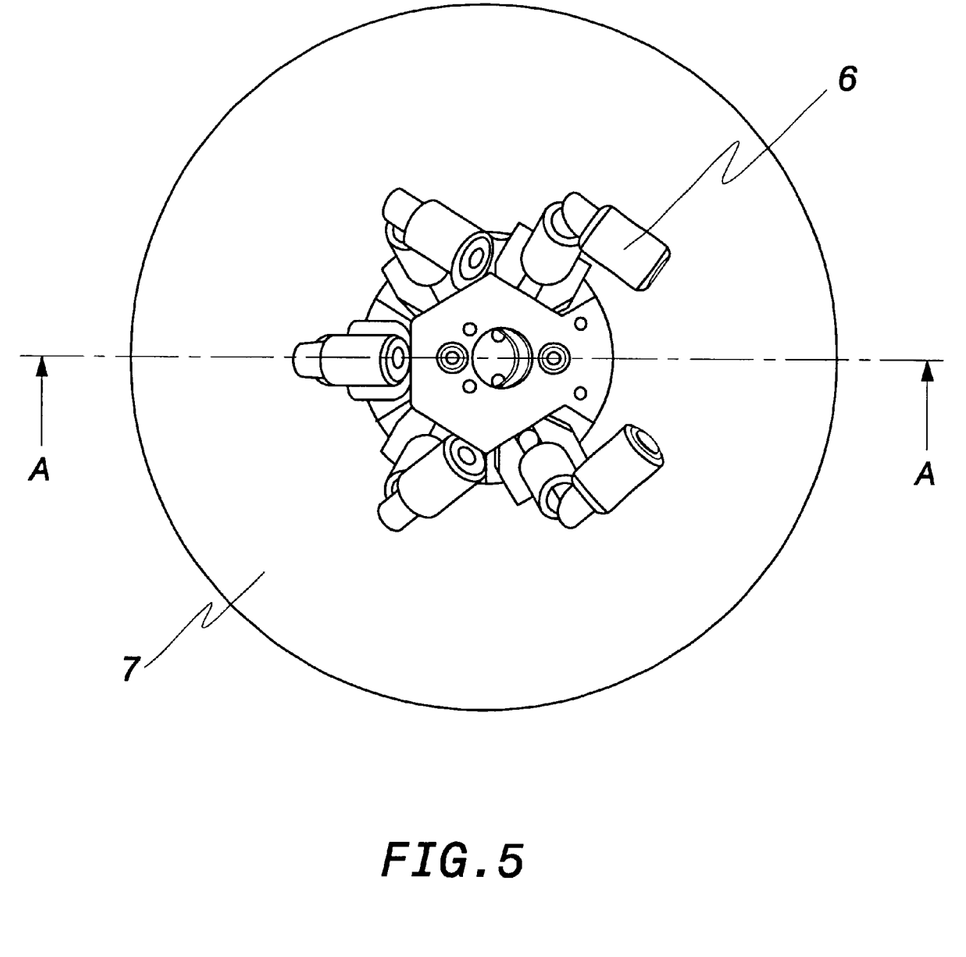
FIG. 5 is a top view of the spray head and nozzle mechanism of the present invention.
Figure 6:
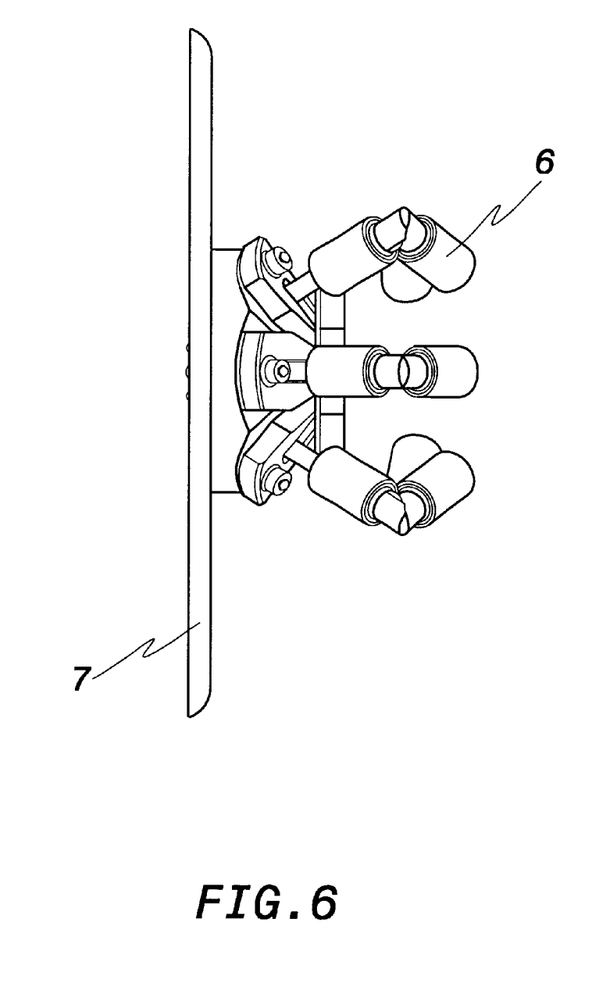
FIG. 6 is a side view of the spray head and nozzle mechanism of the present invention.
Figure 7:
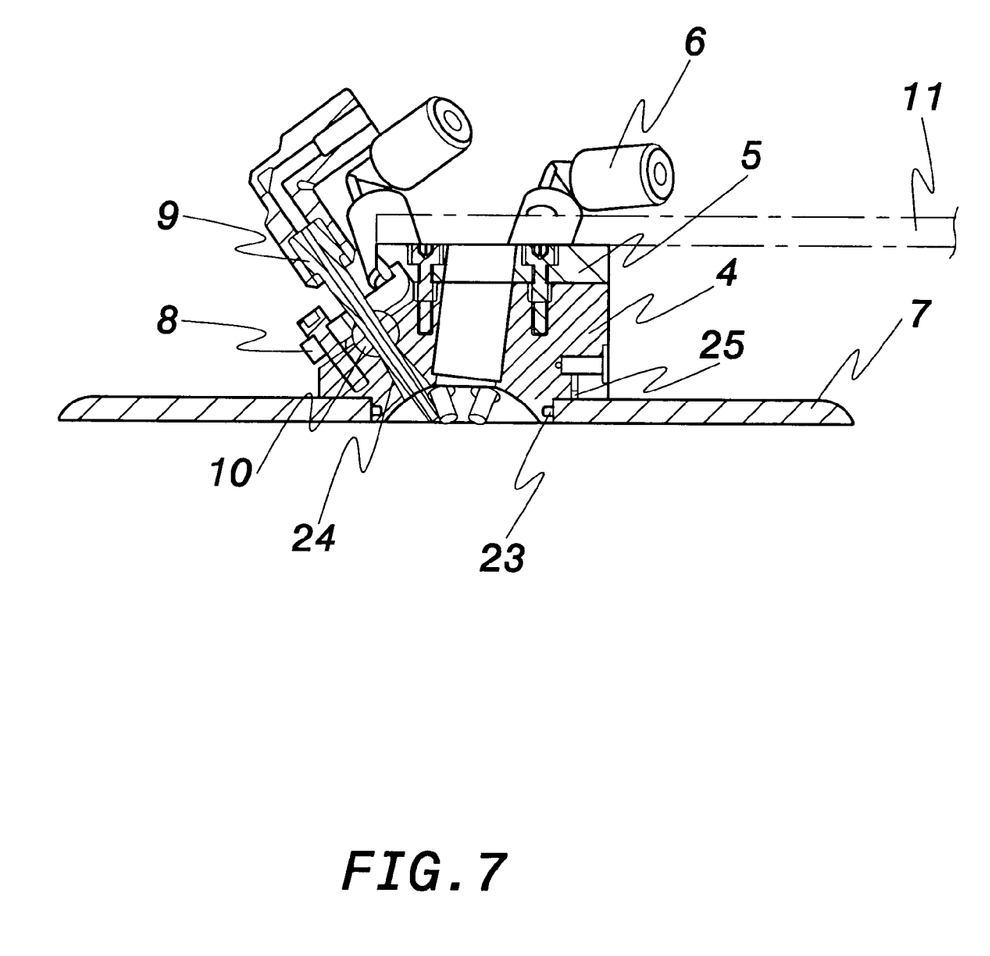
FIG. 7 is a cross-sectional view of the present invention along the A—A line in FIG. 5.

Please refer to FIGS. 5 to 7 simultaneously. The spray head and nozzle mechanism of the present invention comprises a spray head 4 and five nozzles 9. The spray head 4 is processed to have five sideward grooves 24 of specific angle for the placement of the nozzles 9 and ball connectors 10. A nozzle depressor 8 is used to cover the ball connector 10 to prevent the nozzle from moving out, and to depress the ball connector 10 so that the ball connector 10 and the spray head 4 will be stuck tightly to prevent the leakage of chemicals. Because of the design of the ball seat of the spray head 4 and the nozzle depressor 8, a proper adjustment space can be provided for the ball connector 10 so that the nozzle can be tilted a proper angle and adjusted to match the manufacturing process. Therefore, unsprayed regions on the surface of wafers and back spilling of chemicals can be avoided. The top end of the nozzle 9 is further connected to an acid-providing system (not shown) via a bent pipe 6. Material of this part must have good tolerance and cleanness, and cannot be easily contaminated due to temperature and chemicals.

The spray head 4 joins a cover plate of spray head 5 and an upper cover of reaction chamber 7. The cover plate 5 joins a connecting plate 11. Thereby, levels of the spray head 4 and the upper cover 7 can be adjusted through the level adjusting mechanism of spray head. Moreover, in consideration of conveniences of maintenance and assembly/disassembly of the upper cover 7, the spray head 4 is processed to have a ringed channel 25 for sucking up the upper cover 7 by means of vacuum clamping. An acid-resistant O-ring 23 is also matched to prevent the leakage of chemicals. Because there are no locking components such as screws, this way of sucking up the upper cover 7 by means of vacuum clamping can prevent the generation of particles to contaminate the wafers.

Figure 8:
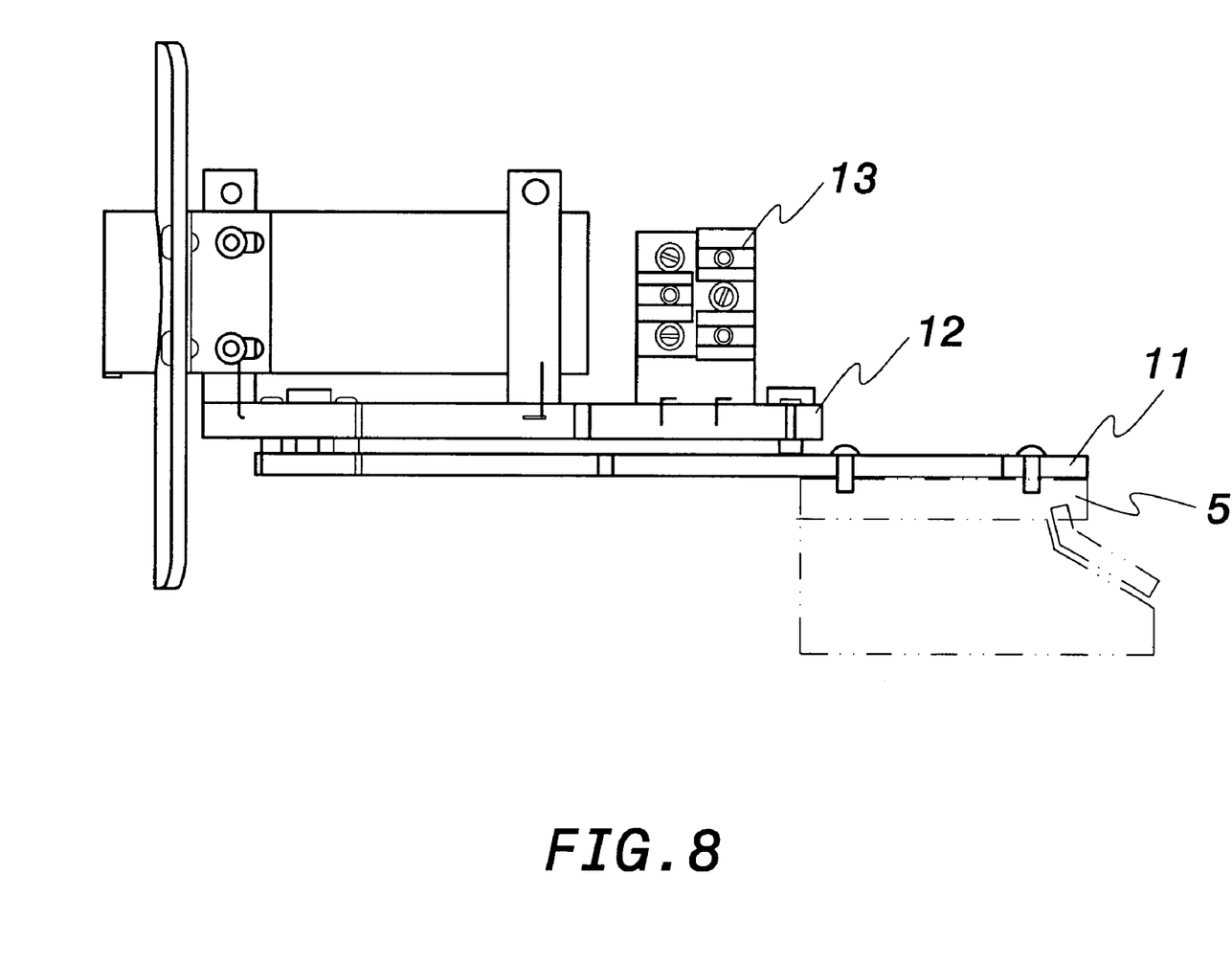
FIG. 8 is a front view of the level adjusting mechanism of the spray head of the present invention.
Figure 9:
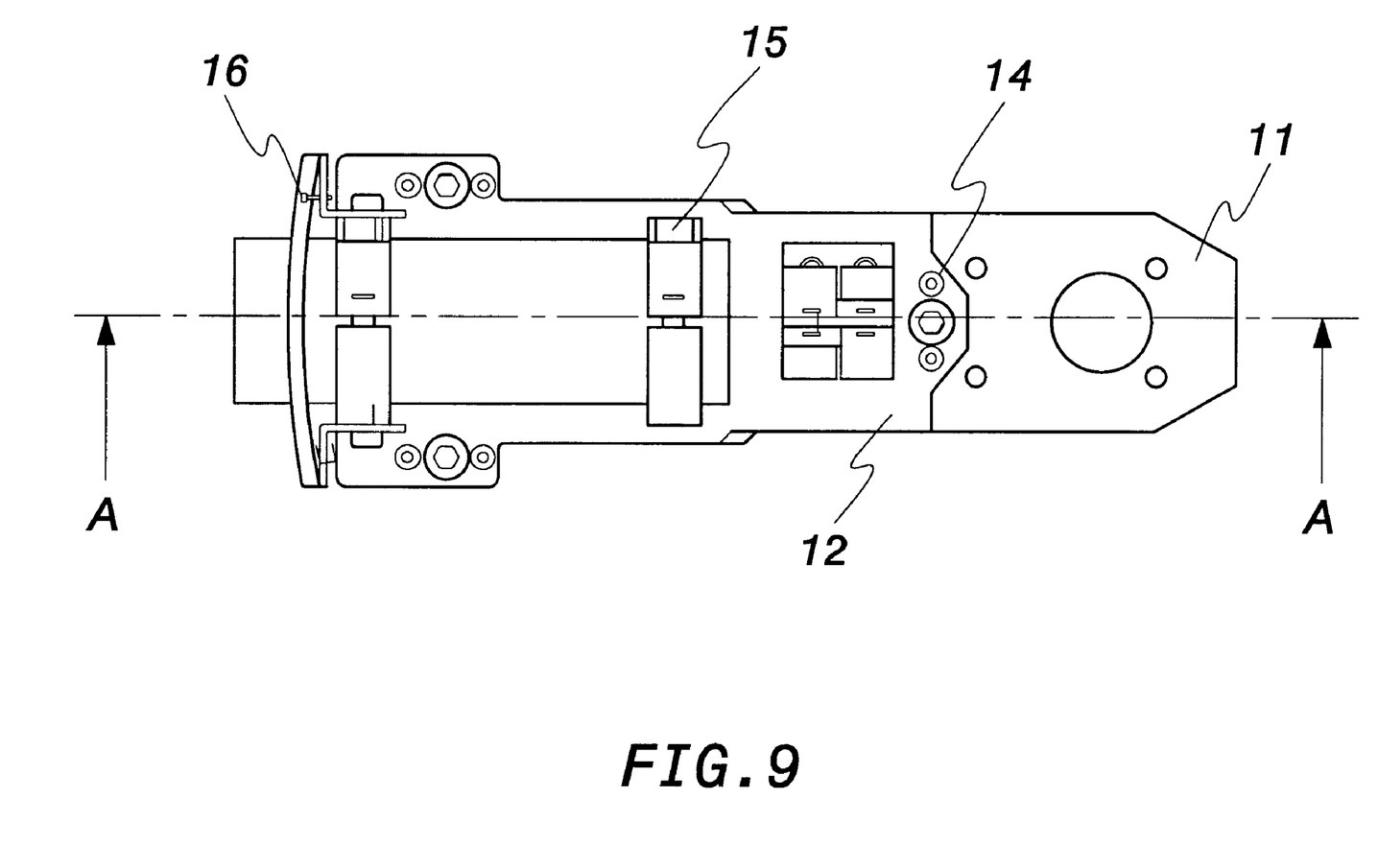
FIG. 9 is a top view of the level adjusting mechanism of the spray head of the present invention.
Figure 10:
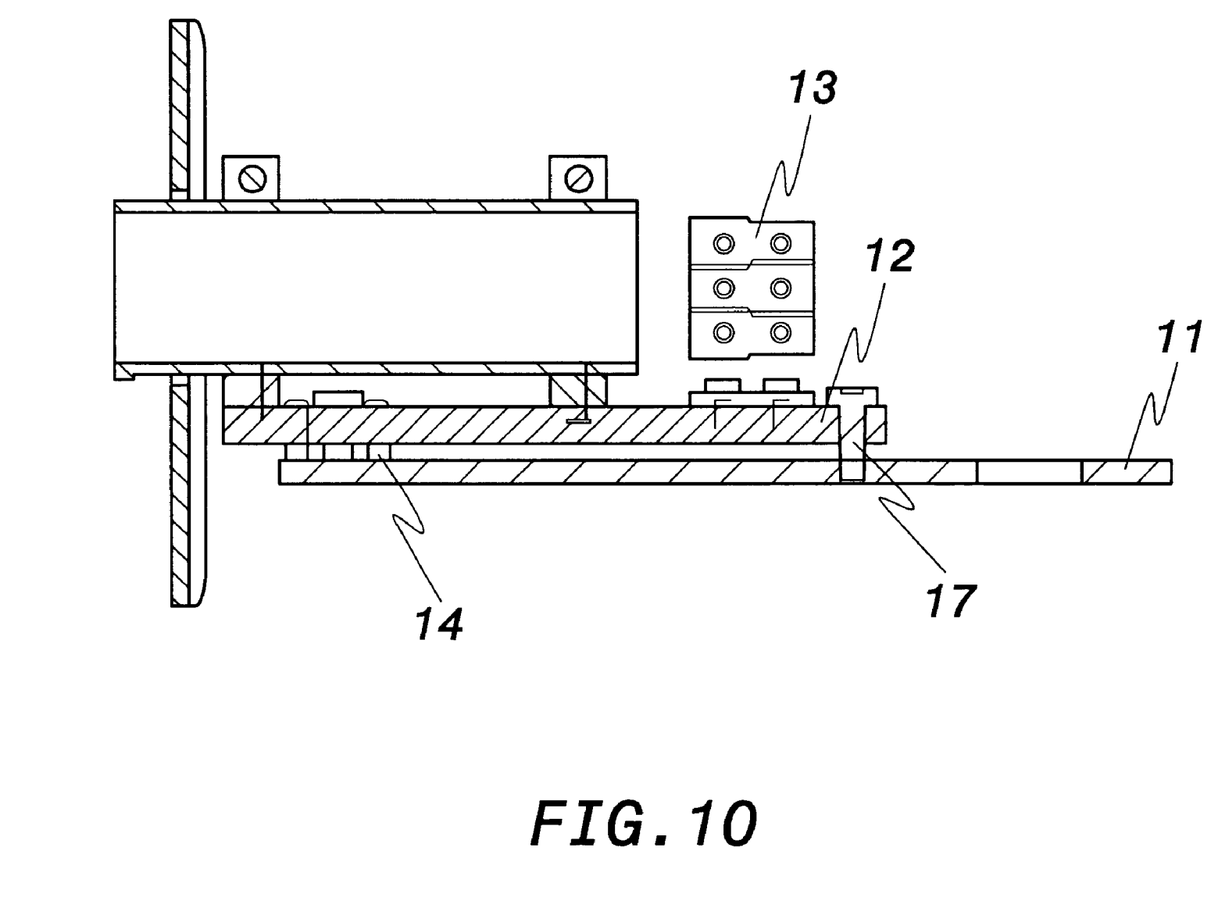
FIG. 10 is a cross-sectional view of the present invention along the A—A line in FIG. 9.

Please refer to FIGS. 8 and 9 simultaneously. The level adjusting mechanism of spray head comprises a connecting plate 11 and a level adjusting plate 12. The cover plate 5 joins the connecting plate 11. The adjusting plate 12 has a plurality of sets of adjusting studs 14 and locking studs 17. The connecting plate 11 and the level adjusting plate 12 are adjusted through the adjusting studs 14 so as to adjust the designed gap between the upper cover 7 and a rotation chuck (not shown). The locking studs 17 are then used for fixing. One end of the level adjusting plate 12 is connected to an outer housing of reaction chamber 16, which is designed to match the elevation of the spray arm 3 so that the outer environment can be effectively isolated.

As shown in FIGS. 1 to 4, the spray arm 3 is fixed through the clamping of a rotation seat 20. The rotation seat 20 and a supporting seat 22 are connected via a bearing 21 so that the spray arm 3 can rotate freely. A retaining mechanism (not shown) is further designed in consideration of both the fabrication and maintenance. The whole spray arm 3 is clamped steadily. Two sets of rotation seats 20 are adopted so that they can be evenly fixed on an elevating plate 18. The elevating plate 18 is locked with an elevating slide block 2. Once an elevating motor (not shown) starts to rotate, the elevating slide block 2 will be driven by a screw bar (not shown) to generate straight motion, thereby driving the spray arm 3 to make straight elevation.

The present invention provides a nozzle and adjust module for spraying liquid on the surface of wafers, and matches the requirements of the manufacturing process and environment so that it can apply to both closed and open reaction chambers. Moreover, the nozzle and adjust module of the present invention can meet the requirement of convenience of maintenance. As shown in FIGS. 1 to 4, when wafers are loaded on a chuck 26 of a reaction chamber via a transport arm, the wafers 27 are fixed on the chuck 26 by means of vacuum suction. Through driving the elevation slide block 2 and the elevating plate 18 slidably matched on a support 1 by a motor, the spray arm 3 along with the upper cover of reaction chamber 7 is lowered to a position having a gap of 0.5 mm distant form the height of the chuck 26. Thereby, a closed reaction chamber is formed. If the gap is not uniform, three sets of the adjusting studs 14 and the clamping studs 15 can be tuned to meet the requirements of the fabrication environment. Chemicals required for the manufacturing process are transported into the passages from tanks of the chemicals by clean and compressed high-pressure gases, then enter into the sideward nozzles 9 in the spray head 4 via an erosion-resistant plastic bent pipe 6, and are finally sprayed on the surfaces of the wafers 27. Through the flexibility of the ball connectors 10, specific angle of the nozzles 9 can be adjusted to match the requirements of the manufacturing process for the sprayed positions on the wafers. Furthermore, the spray head 4 has five coned holes (for the nozzle to have an adjustment space in the hole) for placing five different chemicals such as deionized (DI) water, nitrogen, isopropanol, and other two chemicals. A rotation motor drives the chuck 26 and the wafers 27 to rotate so that chemicals can be evenly coated on the wafers 27, thereby completing the spraying operation successfully. After all the fabrication procedures are finished, if the components of the reaction chamber need to be maintained or cleaned, the spray arm 3 is lifted by the elevation motor to the maintenance height. A fixing pin (not shown) for fixing the clamping mechanism is pulled, and then the spray 3 is rotated about 60 degrees manually. Next, the fixing pin is put down to fix the position of the spray arm 3. The assembly/disassembly and maintenance of the components of the reaction chamber are then performed.

To sum up, the present invention can meet the requirements of different manufacturing processes by adjusting the height of the nozzles 9 through the elevating motor. There are five separate nozzles 9 of different chemicals in the spray head 4 of the present invention. Not only can the cross contamination between passages be avoided, but also can the flexibility of selection of chemicals be enhanced. The nozzles 9 of the present invention can be stationary, or can make straight motion or reciprocating swing within a certain angle along with the spray arm 3.

Although the present invention has been described with reference to the preferred embodiments thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

We claim:

1. A nozzle and adjust module, comprising:

a reaction chamber having an upper cover and a rotation chuck; and a spray head and nozzle mechanism having a plurality of sideward grooves arranged at angles and a plurality of ball seats for the placement of respective nozzles and ball connectors, each of said sideward grooves having a nozzle depressor to cover a respective ball connector so that the respective nozzles can be tilted at a desired angle and adjusted, the top end of said nozzle being connected to an acid-providing system via a bent pipe, a cover plate of said spray head joining a connecting plate so that said spray head and said upper cover of said reaction chamber can be adjusted through a level adjusting mechanism of said spray head; a wherein said level adjusting mechanism of said spray head comprises a connecting plate and a level adjusting plate, said level adjusting plate having a plurality of sets of adjusting studs and locking studs, an outer housing of said reaction chamber and a spray arm being fixed on said level adjusting plate respectively using a clamping block and a clamping stud.

2. A nozzle and adjust module, comprising:

a reaction chamber having an upper cover and a rotation chuck; and a spray head and nozzle mechanism having a plurality of sideward grooves arranged at angles and a plurality of ball seats for the placement of respective nozzles and ball connectors, each of said sideward grooves having a nozzle depressor to cover a respective ball connector so that the respective nozzles can be tilted at a desired angle and adjusted, the top end of said nozzle being connected to an acid-providing system via a bent pipe, a cover plate of said spray head joining a connecting plate so that said spray head and said upper cover of said reaction chamber can be adjusted through a level adjusting mechanism of said spray head; and a rotation mechanism of a spray arm, said rotation mechanism comprising a spray arm and a rotation seat, said rotation seat clamping said spray arm via a clamping stud and being placed on a supporting seat, said rotation seat and said supporting seat being connected via a bearing so that said spray arm can rotate freely.

3. The nozzle and adjust module as claimed in claim 2, wherein said spray arm is clamped steadily, and two sets of said rotation seats and said supporting seats are evenly fixed on an elevating plate, said elevating plate being locked with an elevating slide block, said spray arm being driven to make a straight elevation by driving said elevating slide block to make a straight motion through an elevating motor and a screw bar.

4. A nozzle and adjust module comprising:

a reaction chamber having an upper cover and a rotation chuck; and a spray head and nozzle mechanism having a plurality of sideward grooves arranged at angles and a plurality of ball seats for the placement of respective nozzles and ball connectors, each of said sideward grooves having a nozzle depressor to cover a respective ball connector so that the respective nozzles can be tilted at a desired angle and adjusted, the top end of said nozzle being connected to an acid-providing system via a bent pipe, a cover plate of said spray head joining a connecting plate so that said spray head and said upper cover of said reaction chamber can be adjusted through a level adjusting mechanism of said spray head;

wherein said spray head further has a ringed channel for sucking up said upper cover of reaction chamber by means of vacuum clamping, and an acid-resistant O-ring is also matched to prevent the leakage of chemicals.

* * * * *